US009893262B2

(12) United States Patent
Thompson et al.

(10) Patent No.: US 9,893,262 B2
(45) Date of Patent: Feb. 13, 2018

(54) LUMPED-ELEMENT DEVICE FOR QUANTUM INFORMATION PROCESSING SYSTEMS

(71) Applicant: RIGETTI & CO., INC., Berkeley, CA (US)

(72) Inventors: Dane Christoffer Thompson, Granite Bay, CA (US); Chad Tyler Rigetti, Emeryville, CA (US)

(73) Assignee: Rigetti & Co., Inc., Berkeley, CA (US)

( * ) Notice: Subject to any disclaimer, the term of this patent is extended or adjusted under 35 U.S.C. 154(b) by 0 days.

(21) Appl. No.: 15/110,364

(22) PCT Filed: Jul. 6, 2015

(86) PCT No.: PCT/US2015/039206
§ 371 (c)(1),
(2) Date: Jul. 7, 2016

(87) PCT Pub. No.: WO2017/007446
PCT Pub. Date: Jan. 12, 2017

(65) Prior Publication Data
US 2017/0148972 A1  May 25, 2017

(51) Int. Cl.
*H01P 7/08* (2006.01)
*H03H 7/01* (2006.01)
(Continued)

(52) U.S. Cl.
CPC ............ *H01L 39/025* (2013.01); *H01L 39/12* (2013.01); *H01P 3/081* (2013.01); *H01P 7/082* (2013.01);
(Continued)

(58) Field of Classification Search
CPC ...... H01L 39/025; H01L 39/12; H01P 11/003; H01P 3/081; H01P 7/082; H03H 3/00; H03H 7/0138
(Continued)

(56) References Cited

U.S. PATENT DOCUMENTS 5,485,131 A   1/1996  Fajen
5,834,995 A *  11/1998  Richards ............... H01P 11/003
                                               205/123

(Continued)

FOREIGN PATENT DOCUMENTS

EP           1189344         8/1995
WO         2015/178990      11/2015
(Continued)

OTHER PUBLICATIONS

European Patent Office, "Extended European Search Report", dated Mar. 3, 2017 in European application No. 15882282.5 (RIGET-011EP1), 9 pages.
(Continued)

*Primary Examiner* — Dean Takaoka
*Assistant Examiner* — Alan Wong
(74) *Attorney, Agent, or Firm* — Henry Patent Law Firm PLLC (57) ABSTRACT

In some aspects, a quantum information processing circuit includes a lumped-element device on the surface of a dielectric substrate. The lumped-element device can include a capacitor pad and an inductive transmission line. The capacitor pad can be capacitively coupled to another capacitor pad. The inductive transmission line can reside in an interior clearance area defined by an inner boundary of the capacitor pad. The lumped-element device can be, for example, a resonator device or a filter device. The inductive transmission line can be, for example, a meander inductor.

30 Claims, 6 Drawing Sheets (51) Int. Cl.
*H01L 39/02* (2006.01)
*H01P 3/08* (2006.01)
*H03H 3/00* (2006.01)
*H01P 11/00* (2006.01)
*H01L 39/12* (2006.01)

(52) U.S. Cl.
CPC .............. *H01P 11/003* (2013.01); *H03H 3/00* (2013.01); *H03H 7/0138* (2013.01)

(58) Field of Classification Search
USPC .................................. 333/172–174, 202, 204
See application file for complete search history.

(56) References Cited

U.S. PATENT DOCUMENTS

| 7,610,072 B2 | 10/2009 | Ye |
| 8,841,764 B2* | 9/2014 | Poletto .................... H01L 39/04 257/712 |
| 8,954,125 B2* | 2/2015 | Corcoles Gonzalez ............. G06N 99/002 327/564 |
| 2005/0206481 A1† | 9/2005 | Koizumi et al. |
| 2008/0048799 A1* | 2/2008 | Wang .................... H01P 1/2039 333/156 |
| 2011/0022340 A1 | 1/2011 | Divincenzo et al. |
| 2012/0193996 A1 | 8/2012 | Ruy et al. |
| 2012/0319684 A1 | 12/2012 | Gambetta et al. |
| 2013/0029848 A1 | 1/2013 | Gonzalez et al. |
| 2014/0203838 A1 | 7/2014 | Pesetski et al. |
| 2016/0364653 A1† | 12/2016 | Chow et al. |

FOREIGN PATENT DOCUMENTS

| WO | 2015/178991 | 11/2015 |
| WO | 2015/178992 | 11/2015 |

OTHER PUBLICATIONS

Hoffman, et al., "Atoms Talking to Squids", arxiv.org, Cornell University Library, 201 Olin Library Cornell Jniversity, Ithaca, NY, Aug. 21, 2011, 1 pages.

Siddiqi, "Superconducting qubits: poised for computing?", Superconducting Science and Technology, vol. 24; IOP Publishing, Techno House, Bristol, GB, Jul. 21, 2011, 9 pages.
Bahl, I., Lumped Elements for RF and Microwave Circuits, Artech House, Boston, 2006, 509 pages.
Cam Nguyen, Radio-Frequency Integrated-Circuit Engineering, Chapter 3—"Lumped Elements," Published Feb. 2015, 78 pages.
Simon, R.W., et al., Superconducting Microwave Filter Systems for Cellular Telephone Base Stations, Proceedings of the IEEE, Vo. 92, No. 10, Oct. 2004, 12 pages.
Laforge, P., "Tunable Superconducting Microwave Filters," Thesis—University of Waterloo, 2010, 159 pages.
Setoodeh, S., "Superconducting Microwave Filters," Thesis—University of Waterloo, 2011, 103 pages.
Goppl, M., et al., Coplanar Waveguide Resonators for Quantum Electrodynamics, arXiv:0807.4094v1, dated Jul. 2008, 8 pages.
International Search Report and Written Opinion dated May 10, 2016, for PCT Application No. PCT/US2015/039206 filed Jul. 6, 2015, 11 pages.
E. Oghereohwo et al., Design and Analysis of Meander Microstrip Antenna at Wireless Band, International Journal of Computer Applications, vol. 111, No. 6, Feb. 2015.†
Young-Taek Lee et al., A Compact-Size Microstrip Spiral Resonator and Its Application to Microwave Oscillator, IEEE Microwave and Wireless Components Letters, vol. 12, No. 10, Oct. 2002.†
Ogherohwo, E. P et al., Design and Analysis of Meander Microstrip Antenna at Wireless Band, International Journal of Computer Applications vol. 111, No. 6, Feb. 2015.†
Young-Taek Lee, A Compact-Size Microstrip Spiral Resonator and Its Application to Microwave Oscillator, Letters 12, 375, Oct. 2002.†
E. Ogherohwo et al., Design and Analysis of Meander Microstrip Antenna at Wireless Band, International Journal of Computer Applications, vol. 111, No. 6, Feb. 2015.†
Khelifa Hettak et al., A Class of Novel Uniplanar Series Resonators and Their Implementation in Original Applications, IEEE Transactions on Microwave Theory and Technique, vol. 46, No. 9, Sep. 1998.†

* cited by examiner
† cited by third party

LUMPED-ELEMENT DEVICE FOR QUANTUM INFORMATION PROCESSING SYSTEMS

BACKGROUND

The following description relates to lumped-element devices that can be used, for instance, in quantum information processing systems.

Microwave circuit topologies typically include signal and ground electrodes on the surface(s) of a dielectric substrate. Such topologies are often used for transferring and processing microwave signals. Some topologies include transmission line systems that can operate as resonators or filters.

SUMMARY

In a general aspect, a lumped-element device includes an inductor nested in a capacitor pad.

In some aspects, a quantum information processing circuit includes a dielectric substrate and a lumped-element device on the dielectric substrate. The lumped-element device includes a first capacitor pad on the dielectric substrate and an inductive transmission line on the dielectric substrate. The first capacitor pad is capacitively coupled to a second capacitor pad. The first capacitor pad has an outer boundary and an inner boundary, and the inner boundary defines an interior clearance area in the first capacitor pad. The inductive transmission line resides in the interior clearance area in the first capacitor pad.

In some aspects, a lumped-element device is formed in a quantum information processing circuit. A first capacitor pad and an inductive transmission line are formed on a surface of a dielectric substrate. The first capacitor pad is capacitively coupled to a second capacitor pad. The first capacitor pad has an outer boundary and an inner boundary, and the inner boundary defines an interior clearance area in the first capacitor pad. The inductive transmission line is formed in the interior clearance area in the first capacitor pad.

Implementations of these and other aspects may include one or more of the following features. The quantum information processing circuit comprises a coplanar waveguide topology, where the lumped-element device resides on a first side of the dielectric substrate, and a ground conductor also resides on the first side of the dielectric substrate. The ground conductor or another electrode on the first side of the dielectric substrate can serve as the second capacitor pad.

Implementations of these and other aspects may include one or more of the following features. The quantum information processing circuit comprises a microstrip topology, where the lumped-element device resides on a first side of the dielectric substrate, and a ground conductor resides on a second, opposite side of the dielectric substrate. The ground conductor or another electrode on the first side of the dielectric substrate can serve as the second capacitor pad.

Implementations of these and other aspects may include one or more of the following features. The inductive transmission line comprises a meander inductor in the interior clearance area in the first capacitor pad. The inductive transmission line includes an end coupled to the inner boundary of the first capacitor pad, an end coupled to the ground conductor, or both.

Implementations of these and other aspects may include one or more of the following features. The lumped-element device comprises a microwave resonator device having a resonance frequency in the range of two hundred (200) MHz to twenty (20) GHz. The largest spatial dimension of the lumped-element device is less than one-tenth of a guided wavelength at the lowest-mode resonance frequency of the resonator device. The lumped-element device can be a microwave resonator device having a resonance frequency that is defined at least in part by a capacitance between the first and second capacitor pads and an inductance of the inductive transmission line.

Implementations of these and other aspects may include one or more of the following features. The lumped-element device can be configured, for example, as a filter device or a resonator device. A size parameter of the first and second capacitor pads can be defined to control a resonance frequency of the device. A size parameter of the inductive transmission line can be defined to control a resonance frequency of the device. The quantum information processing circuit may include a qubit device coupled to the lumped-element device.

Implementations of these and other aspects may include one or more of the following features. At least a portion of the first capacitor pad and the inductive transmission line are formed by depositing a single layer of conductor material on the dielectric substrate. The first capacitor pad and the inductive transmission line can be made of superconducting material. The dielectric substrate can be silicon, sapphire, diamond or another dielectric material.

In some instances, implementations of these and other aspects may provide one or more of the following advantages. Some implementations include microwave resonator devices that have specific frequency and mode characteristics, are compact, reliable, tunable, and integrated with standard wafer-scale fabrication processes. For example, in some implementations, resonator devices can be made smaller than some conventional resonator designs permit (e.g., five times smaller than some standard designs). As another example, in some implementations, resonator devices can be designed to achieve a larger ratio between the desired resonance frequency and an undesired spurious mode (e.g., the first higher undesired frequency). In some instances, the ratio between the spurious mode and the operating frequency of the resonator device can be 4:1, 5:1 or greater. As another example, in some implementations, resonator devices can be fabricated by a fabrication process that requires fewer fabrication steps than some conventional designs. In some instances, resonator devices can be patterned in a single photolithographic step, without necessarily requiring air bridges, wire bonds, middle-insulator-metal dielectrics, or other structures. As another example, in some implementations, electronic properties of resonator devices can be tuned by adjusting independent size parameters of the resonator devices. In some instances, independent parameters (e.g., the size of a gap, the length of a conductor, etc.) can be individually adjusted to tune the inductance (L), capacitance (C) or other properties of the resonator device (e.g., input coupling, inter-resonator coupling, etc.).

The details of one or more implementations are set forth in the accompanying drawings and the description below. Other features, objects, and advantages will be apparent from the description and drawings, and from the claims.

DETAILED DESCRIPTION

In some aspects of what is described here, lumped-element devices can be designed and fabricated for use in quantum computing systems. In some instances, the lumped-element devices can be implemented as miniaturized microwave frequency resonators or miniaturized microwave frequency filters. Such devices can be used as building blocks in a larger system, for example, in a quantum information readout device, a Purcell filter device, a multiplexer or de-multiplexer device, or in other systems. In some cases, such devices can be used as microwave filters for telecommunications, microwave frequency analog signal filtering or other purposes.

In some implementations, a lumped-element device can be adapted for quantum information processing and quantum computing applications. For instance, an LC electromagnetic device can be constructed with low-loss materials according to a reliable fabrication process, having a design that reduces or minimizes the footprint of the device and provides suitable resonance characteristics for quantum information processing circuits. In some cases, a device has a single-layer photolithographic design that can be integrated in a coplanar waveguide topology or microstrip topology. For instance, the resonator device can include an inductance formed by a meander inductor, a spiral inductor, or an inductor having another shape integrated into a coplanar waveguide topology or microstrip topology. In some cases, a resonator device has a capacitance and inductance that define a resonance characteristic and that allow the resonator to interact with a qubit device, for example, as a readout resonator to detect the state of the qubit device.

In some implementations, a quantum information processing circuit includes a lumped-element device on a dielectric substrate. For instance, a quantum information processing circuit can include any of the lumped-element devices (116, 216, 316A, 316B, 416, 516, 716) shown in FIGS. 1, 2, 3A, 3B, 4, 5 and 7. In some cases, the lumped-element device can be configured to operate as a resonator device, a filter device, or another type of circuit element. In the examples shown in FIGS. 1, 2, 3A, 3B, 4, 5 and 7, the lumped-element device includes a capacitance provided by first and second capacitor pads and an inductance provided by an inductive transmission line. In some implementations, a ground conductor serves as the second capacitor pad, and a meander inductor serves as the inductive transmission line. In some cases, the capacitance and inductance can be tuned to select a resonance frequency of the device. For instance, in some lumped-element devices, the LC characteristics can be selected to define a resonance frequency in the range of two hundred (200) MHz to twenty (20) GHz or another range.

Figure 7:
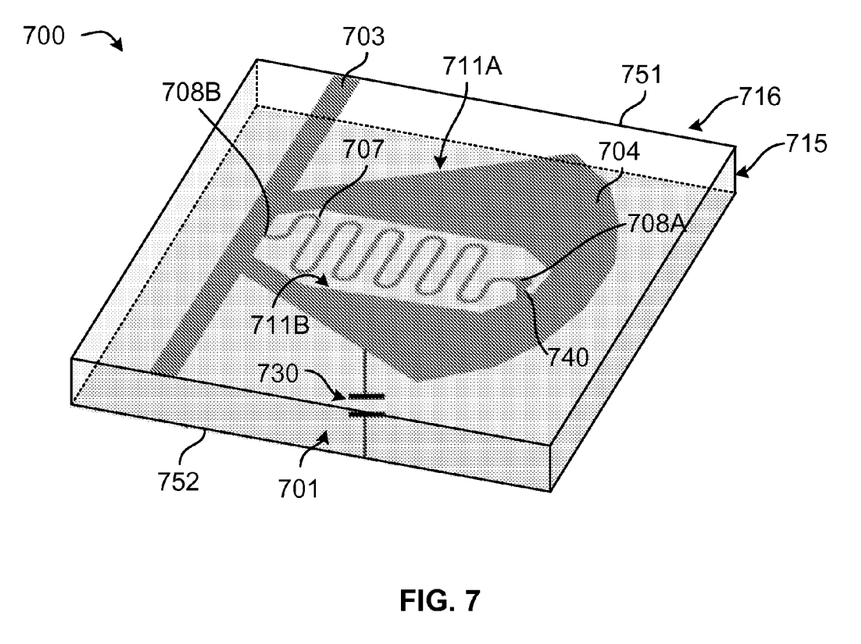
FIG. 7 is a diagram of a microstrip system that includes another example lumped-element device.

In some implementations, a lumped-element device is formed in an electromagnetic system having a microstrip topology, a coplanar waveguide topology, or another topology. In some example microstrip systems, the lumped-element device can be configured as a series bandpass resonator, a parallel bandstop resonator, a parallel bandpass resonator or a series bandstop resonator. For instance, the example lumped-element device shown in FIG. 7 is configured as a parallel bandpass resonator, but it can be reconfigured (e.g., by changing the connectivity between the capacitor pad, the signal line, the meander inductor, and the ground conductor; by reconfiguring or adding additional electrodes; etc.) as another type of resonator. In some example coplanar waveguide systems, the lumped-element device can be configured as a parallel bandpass resonator, a parallel bandstop resonator, a low pass filter or a high pass filter. For instance, the example lumped-element devices shown in FIGS. 1, 2, 3A, 3B, 4, 5 and 7 are configured as a parallel bandpass resonator, but they can be reconfigured (e.g., by changing the connectivity between the capacitor pad(s), the signal line(s), the meander inductor, and the ground conductor; by reconfiguring or adding additional electrodes; etc.) as another type of resonator or filter.

Figure 1A:
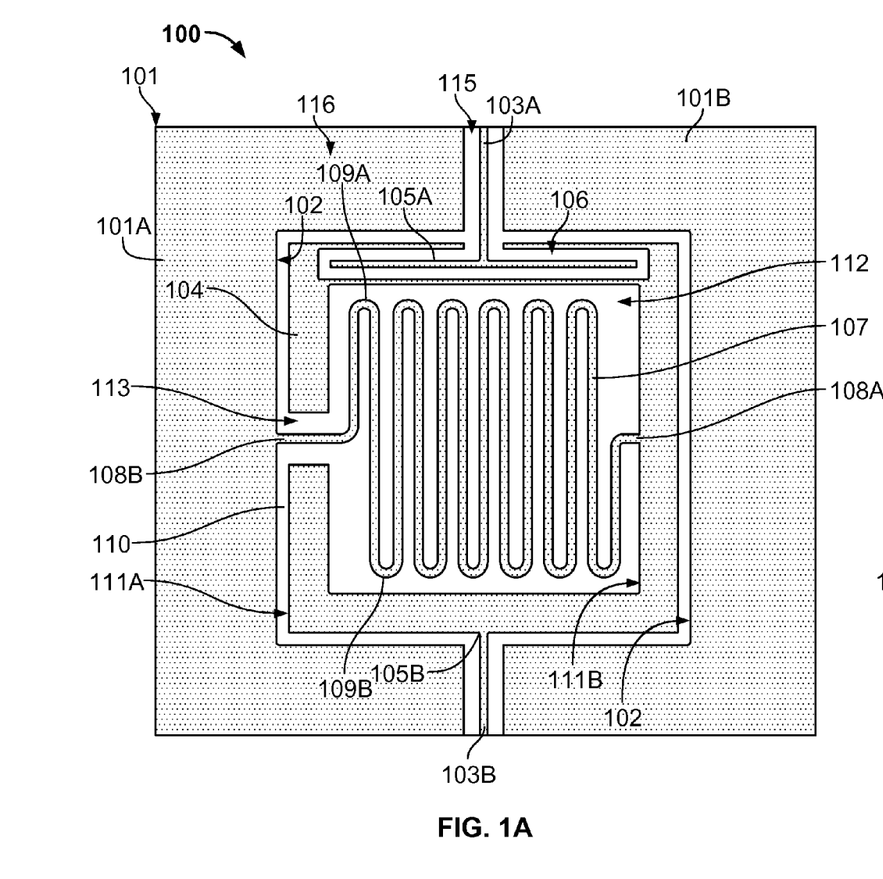
FIG. 1A is a diagram of a coplanar waveguide system that includes an example lumped-element device.
Figure 1B:
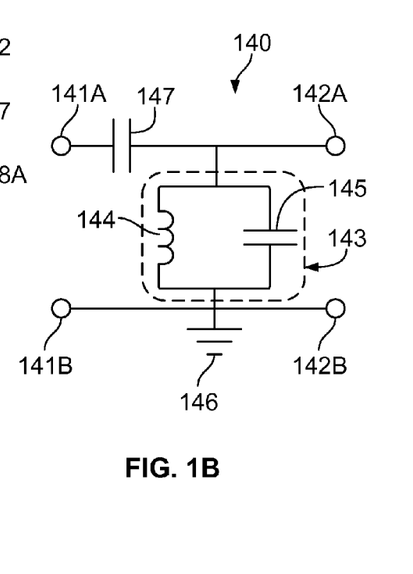
FIG. 1B is a circuit diagram showing an equivalent circuit model of the coplanar waveguide system 100 shown in FIG. 1A.

FIG. 1A is a diagram of an example coplanar waveguide system 100 that includes an example lumped-element resonator device 116; FIG. 1B is a circuit diagram showing an equivalent circuit model 140 of the coplanar waveguide system 100 shown in FIG. 1A. In the circuit model 140 shown in FIG. 1B, the resonator device 116 is represented by a resonant circuit 143 that includes an effective inductance 144 and an effective capacitance 145 in parallel. The coplanar waveguide system 100 may include additional or different features, and the components of a coplanar waveguide system can be arranged as shown in FIG. 1A or in another manner.

The example coplanar waveguide system 100 shown in FIG. 1A includes a single layer of conducting material on a dielectric substrate 115. The dielectric substrate can be a low-loss dielectric material, such as, for example, silicon, diamond, sapphire or another dielectric material. The conducting material on the dielectric substrate 115 can include superconducting material, such as, for example, aluminum, niobium, metal alloys or a combination of these and other types of materials. In some instances, the coplanar waveguide system 100 operates at a temperature where the conducting material on the dielectric substrate 115 is superconducting. For instance, the coplanar waveguide system 100 may be cooled to cryogenic temperatures at or below 60 K, 3 K, 800 mK, 150 mK, 10 mK, 5 mK, etc. As an example, the coplanar waveguide system 100 may include a qubit device that operates below 150 mK in the range of two hundred (200) MHz to twenty (20) GHz. In some cases, the coplanar waveguide system 100 includes multiple layers of conducting material on the dielectric substrate 115.

In the example shown in FIG. 1A, the components of the resonator device 116 are planar structures made of conducting material on the dielectric substrate 115. The example resonator device 116 is bordered by a planar ground conductor 101. The example ground conductor 101 shown in FIG. 1A includes a ground conductor portion 101A on the left side of the diagram and another ground conductor portion 101B on the right side of the diagram; the two ground conductor portions 101A, 101B are part of a common ground structure on the dielectric substrate 115. The example resonator device 116 is connected to signal lines 103A, 103B that reside in respective channels between the ground conductor portions 101A, 101B. The signal lines 103A, 103B can provide signaling and communication between the resonator device 116 and another device in the coplanar waveguide system 100 or an external system.

The example resonator device 116 shown in FIG. 1A includes a capacitor pad 104 on the dielectric substrate 115 and a meander inductor 107 on the dielectric substrate 115. The example capacitor pad 104 and the example meander inductor 107 are implemented as planar metal structures formed on the surface of the dielectric substrate 115. In the example shown in FIG. 1A, the components of the resonator device 116 are in the same plane as the signal lines 103A, 103B and the ground conductor 101. The example resonator device 116 may include additional or different features, and the features of the resonator device 116 can be arranged as shown in FIG. 1A or in another manner.

In the example shown in FIG. 1A, the ground conductor 101 includes a cutout that is shaped to accommodate the resonator device 116, and the capacitor pad 104 is surrounded by the ground conductor 101. The cutout in the ground conductor 101 defines an inner boundary 102 that has the same shape as the outer boundary 111A of the capacitor pad 104. In the example shown in FIG. 1A, the cutout in the ground conductor 101 and the outer perimeter of the resonator device 116 are both square. In some implementations, the cutout and the resonator device perimeter have another shape (e.g., circular, elliptical, hexagonal, rectangular, octagonal, etc.). Some examples are shown in FIGS. 2, 3A, 3B, 4, 5 and 7; some implementations may include other shapes.

In the example shown in FIG. 1, the ground conductor 101 serves as a second capacitor pad that forms a capacitance with the capacitor pad 104. The example capacitor pad 104 is capacitively coupled to the ground conductor 101 across a gap 110 between the outer boundary 111A of the capacitor pad 104 and the inner boundary 102 of the ground conductor 101. The gap 110 is a void (a non-metallized area on the surface of the dielectric substrate 115) between the outer perimeter of the capacitor pad 104 and the inner perimeter of the cutout in the ground conductor 101. In some implementations, the capacitance across the gap 110 provides the effective capacitance of the resonator device 116. For instance, the capacitance across the gap 110 may define the effective capacitance 145 in the circuit model 140 shown in FIG. 1B. Thus, in some instances, the resonator device 116 can be tuned by modifying (increasing or decreasing) the capacitance across the gap 110, for example, by making the gap wider or narrower.

The example capacitor pad 104 has an inner boundary 111B that defines an interior clearance area 112 in the capacitor pad 104. The interior clearance area 112 includes a void (a non-metallized area on the surface of the dielectric substrate 115) within the inner perimeter of the capacitor pad 104. The meander inductor 107 resides in the interior clearance area 112 in the capacitor pad 104. In the example shown, the meander inductor 107 includes a conductive metal strip that extends from a first end 108A connected to the inner boundary 111B of the capacitor pad 104 to a second end 108B connected to the inner boundary 102 of the ground conductor 101. The first end 108A of the meander inductor 107 can be coupled to the capacitor pad 104 conductively (as shown in FIG. 1) or capacitively in some cases. Similarly, the second end 108B of the meander inductor 107 can be coupled to the ground conductor 101 conductively (as shown in FIG. 1) or capacitively in some cases. In the example shown in FIG. 1A, the second end 108B of the meander inductor 107 extends through an opening 113 in the capacitor pad 104. The opening 113 can be provided by forming a void (a non-metallized area on the surface of the dielectric substrate 115) that extends between the gap 110 and the interior clearance area 112 in the capacitor pad.

The meander inductor 107 is an example of an inductive transmission line. In some cases, another type of inductive transmission line (e.g., a spiral inductor, or an inductor having another shape) may be used. The conductor strip that forms the example meander inductor 107 in FIG. 1A follows a meandering path between the first end 108A and the second end 108B. In particular, the meandering path of the conductor strip extends from the inner boundary 102 of the ground conductor 101 through the opening 113, turns at a right angle, follows a series of twelve full turns (the first and second full turns are labeled 109A and 109B in FIG. 1A), then turns at a right angle and connects to the inner boundary 111B of the capacitor pad 104. A meander inductor in a resonator device can be implemented with a different meandering path that may include, for example, a different number of (fewer or greater) turns, turns at different angles, a different (longer or shorter) interval length between turns, different spacing (more or less distance) between the parallel intervals or a combination of these and other types of features.

In the example shown in FIG. 1A, the meander inductor 107 includes twelve full turns (six periods) within the interior clearance area 112 in the capacitor pad 104. The example meander inductors shown in FIGS. 2, 3A, 3B and 4 each include twelve full turns, and the example meander inductor shown in FIG. 5 includes eight full turns. Thus, these examples each include at least four full turns within the interior clearance area in the capacitor pad, and the meandering length of the strip within the interior clearance area provides the primary inductive properties of the meander inductor 107. In some cases, the meander inductor in a lumped-element microwave resonator device includes a different number of turns.

In some implementations, the meander inductor 107 defines the effective inductance of the resonator device 116. For instance, the inductance provided by the meander inductor 107 may define the effective inductance 144 in the circuit model 140 shown in FIG. 1B. Thus, in some instances, the resonator device 116 can be tuned by modifying (e.g. increasing or decreasing) the inductance of the meander inductor 107, for example, by making the meander inductor 107 longer or shorter. Making the meander inductor 107 longer or shorter may be accomplished, for example, by modifying the number of turns, the interval length, the spacing between parallel intervals or a combination of these and other types of modifications.

As shown in FIG. 1A, the resonator device 116 resides in a signal path between the first signal line 103A and the second signal line 103B. The first signal line 103A extends between the ground conductor portions 101A, 101B and terminates at an end 105A that is capacitively coupled to the capacitor pad 104. In the example shown in FIG. 1A, the end 105A of the first signal line 103A is an elongate conducting strip that resides within an interior clearance area 106 on a first side of the capacitor pad 104. The effective capacitance between the first signal line 103A and the capacitor pad 104 is represented by the capacitance 147 in the circuit model 140 shown in FIG. 1B. The second signal line 103B extends between the ground conductor portions 101A, 101B and terminates at an end 105B that is conductively coupled to the capacitor pad 104. In the example shown in FIG. 1A, the end 105B of the second signal line 103B connects directly to the side of the capacitor pad 104 that is opposite of the side where the capacitor pad 104 connects to the first signal line 103A.

In some implementations, the resonator device 116 is coupled to additional or different types of signal lines, and the signal lines can be coupled to the resonator device at additional or different locations. Each of the signal lines can be coupled (e.g., capacitively or conductively) to the respective sides of the capacitor pad, and in some cases, multiple signal lines can be coupled on the same side of the capacitor pad.

In some implementations, the signal lines 103A, 103B are each connected to other respective devices in the coplanar waveguide system 100. As an example, the first signal line 103A may be connected to an input port that receives microwave signals from an external control source, and the second signal line 103B may be coupled to a qubit device that is controlled by microwave signals transmitted through the resonator device 116. The example coplanar waveguide system 100 may include additional feeds for the resonator device 116.

In the example circuit model 140 shown in FIG. 1B, the resonance circuit 143 is connected between input terminals 141A, 141B and output terminals 142A, 142B. One of the input terminals 141B and one of the output terminals 142B are connected to a common ground 146. In some implementations, the input terminals 141A, 141B in the circuit model 140 represent an input feed (e.g., from a control source, etc.) provided by the first signal line 103A, and the output terminals 142A, 142B represent an output feed (e.g., to a qubit device or another type of system) provided by the second signal line 103B.

In some implementations, the resonator device 116 has a resonance frequency in the microwave frequency range, for example, in the range of one (1) to ten (10) gigahertz or another range. For instance, the resonator device 116 may have a resonant frequency that is configured to interact with a qubit device (e.g., a transmon qubit device, a fluxonium qubit device, or another type of quantum coherent device). The resonance frequency of the resonator device 116 can be defined in terms of the effective capacitance and the effective inductance of the resonator device. For instance, the resonance frequency ω of the resonator device 116 can be expressed as $f_0 = 1/(2\pi\sqrt{LC})$, where C represents the effective capacitance 145 and L represents the effective inductance 144 in the circuit model 140 shown in FIG. 1B. In some implementations, the resonance frequency $f_0$ of the resonator device 116 is defined at least partially by the capacitance across the gap 110 between the outer boundary 111A of the capacitor pad 104 and the inner boundary 102 of the ground conductor 101. For example, the capacitance across the gap 110 can define the effective capacitance 145 in some instances. In some implementations, the resonance frequency $f_0$ of the resonator device 116 is defined at least partially by the inductance of the meander inductor 107. For example, the length and other parameters of the meander inductor 107 can define the effective inductance 144 in some instances.

In some implementations, the example resonator device 116 can be formed in the coplanar waveguide system 100 by forming the planar metal structures shown in FIG. 1A on the dielectric substrate 115. For example, the capacitor pad 104, the ground conductor 101 and the meander inductor 107 can be formed in any order, for instance, by a series of deposition processes, or they may be formed together as part of the same deposition process. In some examples, a "sticky" seed layer (e.g., Titanium or another type of material) is deposited, followed by Aluminum or another material. In some cases, all or part of the capacitor pad 104, ground conductor 101 and meander inductor 107 are formed at least partially by depositing a single layer of conductor material on the dielectric substrate. In some implementations, the signal lines 103A, 103B are formed by the same deposition process that is used to form some or all components of the resonator device 116. For instance, the signal lines 103A, 103B can be formed at least partially by depositing a single layer of conducting material on the dielectric substrate that also forms at least part of the capacitor pad 104, the ground conductor 101 and the meander inductor 107.

In the example shown in FIG. 1A, the ground conductor 101 is formed about the capacitor pad 104, and the inner boundary 102 of the ground conductor 101 is separated from the outer boundary 111A of the capacitor pad 104 by the gap 110. The gap 110 can be sized to control a resonance frequency of the resonator device 116. For example, the size of the gap 110 can be specified to provide a particular capacitance between the capacitor pad 104 and the ground conductor 101. The meander inductor 107 is formed in the interior clearance area 112 in the capacitor pad 104, with all of the full turns of the meander inductor inside the interior clearance area 112 and an end 108B of the meander inductor 107 extending through an opening 113 on one side of the capacitor pad 104. The length of the meander inductor 107 can be sized to control a resonance frequency of the resonator device 116. For example, the length of the meander inductor 107 can be specified to provide a particular inductance in the resonator device 116.

The example resonator device 116 shown in FIG. 1A is an example of a lumped-element component. In some example implementations, a lumped-element component in a coplanar waveguide topology is physically small (in its areal extent) compared to the guided wavelength of the coplanar waveguide system. For instance, the largest spatial dimension of the example resonator device 116 (its diagonal) can be less than 1/10 or less than 1/20 of a guided wavelength at the resonance frequency of the resonator device 116.

For some example coplanar waveguide systems, the guided wavelength ($\lambda_g$) can be determined by numerical simulations. In some instances, the guided wavelength can be expressed $$\lambda_g = \frac{c}{f_0 \sqrt{\varepsilon_{\mathit{eff}}}}$$

where c represents the speed of light in vacuum, $f_0$ represents the resonant frequency of the primary mode of the resonator device, and $\varepsilon_{\mathit{eff}}$ represents the effective dielectric constant of the resonator device. For instance, in free space $\varepsilon_{\mathit{eff}} = 1$ and in silicon $\varepsilon_{\mathit{eff}} = 11.9$, and the effective dielectric constant of the resonator device will typically be between these two values when the dielectric substrate 115 is a silicon substrate.

An example of a resonator device has been described with respect to FIGS. 1A and 1B. FIGS. 2, 3A, 3B, 4, 5 and 7 show other examples of resonator devices that have different features. In some cases, the examples shown in FIGS. 2, 3A, 3B, 4, 5 and 7 can be fabricated according to the same or similar processes as the example resonator device 116 shown in FIG. 1A, and can be used in the same or similar manner as the example resonator device 116 shown in FIG. 1A. In some instances, features of the example resonator devices shown in FIGS. 1A, 2, 3A, 3B, 4, 5 and 7 can be combined or modified to fabricate other resonator devices that have the same, similar or different properties.

In some implementations, the example resonator devices can be implemented as small, compact devices. The lumped-element inductance and capacitance of the resonator devices can be substantially smaller than the guided wavelength at the frequency of operation of the resonator device. In some instances, lumped elements provide advantages due to their smaller physical size and larger frequency ratio of primary to secondary resonance. For instance, the largest spatial dimension of the resonator device (its length, width, diagonal, etc.) can be less than 1/10 or less than 1/20 of a guided wavelength at the operating frequency of the resonator device.

Examples of lumped-element components that can be used in planar circuits include spiral inductors, meander inductors, interdigitated capacitors, metal-insulator-metal capacitors and others. Spiral inductors typically include an air bridge/crossovers that can require additional photolithography steps and introduce material that may not be acceptable for some applications. In some cases, spiral inductors have a higher inductance than meander inductors. Interdigitated capacitors can introduce a high E-field and loss at the "fingers" of the interdigitated structure, and metal-insulator-metal capacitors can require additional photolithography steps and introduce material that may not be acceptable for some applications.

Meander inductors are included in the example resonator designs shown in FIGS. 1A, 2, 3A, 3B, 4, 5 and 7. In some instances, other lumped-element components may be selected. In the example resonator designs shown in FIGS. 1A, 2, 3A, 3B, 4, 5 and 7, the meandering conductor strip that forms the meander inductor is co-located with the capacitor and nested within an interior clearance area in the capacitor. The inductance is produced from current flow in a thin meander traced to ground and the associated energy stored in the magnetic field in and around the conductor. The capacitance is formed between a pad (that surrounds the inductor) and an exterior ground plane. Thus, an LC shunt combination creates resonant behavior at a resonant frequency $f_0=1/(2\pi\sqrt{LC})$.

In some implementations of the example resonator designs shown in FIGS. 1A, 2, 3A, 3B, 4, 5 and 7, the inductance may be independently tuned by modifying the length of the meander. To increase inductance, thinning the meander trace enables more meander turns and thus a greater length to fit in the same area. Because inductance is typically proportional to the total meander length, it may be tuned over a wide range of values. As an example, in a first numerical simulation, the example resonator device 116 shown in FIG. 1A was simulated as a 0.8 mm-by-0.8 mm square resonator (having a length and width of 0.8 mm) with the meander inductor having a length of 6.8 mm, and the simulated resonance frequency was 4.25 GHz. In a second numerical simulation, the 0.8 mm-by-0.8 mm square resonator device was simulated with a different meander inductor, this time having a length of 21.4 mm (with the other components being the same), and the simulated resonance frequency was 2.68 GHz. In this example, comparison of the first and second simulations shows that increasing the length of the meander decreases the resonance frequency, demonstrating a tuning range of 1.6 times from the inductance alone.

In the second numerical simulation of the 0.8 mm-by-0.8 mm square resonator, to fit the longer meander trace in the same interior clearance area, the width of the meander was reduced from 15 μm wide to 5 μm wide, and the number of turns was increased from 12 full turns (six periods) to 40 full turns (twenty periods). In both examples, the gap 110 between the capacitor pad 104 and a ground conductor 101 was 20 μm wide. According to the first numerical simulation (with the shorter meander length of 6.8 mm), the first mode was at 4.25 GHz, the second mode was at 18.3 GHz, and the third mode was at 19.9 GHz; thus, the second mode was 4.3 times higher than the first mode. According to the second numerical simulation (with the longer meander length of 21.4 mm) the first mode was at 2.68 GHz, the second mode was at 12.2 GHz, and the third mode was at 18.5 GHz; thus, the second mode was 4.6 times higher than the first mode.

In some implementations of the example resonator designs shown in FIGS. 1A, 2, 3A, 3B, 4 and 5, the capacitance may be independently tuned by modifying the gap between the outer edge of the resonator device and the ground plane. As described above, in the first simulation, the example resonator device 116 shown in FIG. 1A was simulated as a 0.8 mm-by-0.8 mm square resonator (having a length and width of equal size, 0.8 mm) with the gap 110 having a width of 20 μm as described above, and the simulated resonance frequency was 4.25 GHz. In a third simulation, the 0.8 mm-by-0.8 mm square resonator device was simulated with a different gap width, this time having a width of 5 μm (with the other components being the same), and the simulated resonance frequency was 3.518 GHz. In this example, comparison of the first and third simulations shows that increasing the length of the meander decreases the resonance frequency, demonstrating a tuning range of 1.21 times from the capacitance alone. According to the third numerical simulation (with the smaller gap width of 5 μm), the first mode was at 3.5 GHz, the second mode was at 16.6 GHz, and the third mode was at 20.1 GHz; thus, the second mode was 4.7 times higher than the first mode.

In some implementations of the example resonator designs shown in FIGS. 1A, 2, 3A, 3B, 4, 5 and 7, the resonance of the resonator device can be tuned by controlling both the inductance and capacitance, which may provide an even greater range of control. For example, in a fourth numerical simulation, the 0.8 mm-by-0.8 mm square resonator device was also simulated with both modifications described above—the longer meander length (21.4 mm) from the second simulation and the smaller gap width (5 μm) from the third simulation, and the simulated resonance frequency was 2.18 GHz. In this example, comparison of the first and fourth simulations shows that increasing the length of the meander and decreasing the gap width decreases the resonance frequency further, demonstrating a tuning range of 1.95 times from a combination of both factors. According to the fourth numerical simulation (with the longer meander length of 21.4 mm and the smaller gap width of 5 μm) the first mode was at 2.2 GHz, the second mode was at 11.3 GHz, and the third mode was at 16.6 GHz; thus, the second mode was 5.2 times higher than the first mode.

In some implementations of the example lumped-element resonator designs shown in FIGS. 1A, 2, 3A, 3B, 4, 5 and 7, the resonator device provides advantages over a conventional transmission line resonator. For instance, a transmission line resonator may require a planar area that is four to five times larger than a lumped-element resonator having a similar resonance frequency. In one example comparison that was numerically simulated, a transmission line resonator having a resonance frequency of 3.75 GHz had an area of 1.7 mm$^2$, and a lumped-element resonator having a resonance frequency of 3.45 GHz had an area of 0.36 mm$^2$ (between 1/5 and 1/4 the area of the transmission line resonator). The lumped-element resonator may also provide better suppression of higher order modes. For instance, in the simulated comparison just mentioned, the lumped-element resonator suppressed higher order modes greater than five times the base resonance frequency, and the transmission line resonator suppressed higher order modes up to two times the base resonance frequency.

In some implementations of the example resonator designs shown in FIGS. 1A, 2, 3A, 3B, 4, 5 and 7, the electromagnetic coupling strength between a signal line and the resonator device or between two resonators can be tuned. For instance, in an example simulation, the capacitive coupling between the input signal line and the capacitor pad of the resonator device was swept over a wide range without causing a substantial change in the resonance frequency of the resonator device. In the example simulation, the width between the input signal line and the capacitor pad of the resonator device was swept over a range from 50 μm to 700 μm, and the frequency of the resonator changed by only 3.6% (from 4.4 GHz to 4.2 GHz). In these simulations, the Q factor of the resonator varied by 44× over the swept range (of width between the input signal line and the capacitor pad) while the resonant frequency stayed stable. This allows for tuning the coupling over a wide range while not significantly shifting the resonator frequency. The Q factor tuning may be extended into the many thousands, for instance, by backing out the signal line from the resonator.

In some implementations, multiple resonator devices can be coupled together. For instance, a coplanar waveguide system can include two resonator devices side-by-side in the same plane as the ground conductor and the signal line. The ground conductor strip between the two resonator devices can provide capacitive coupling between the resonator devices, and the separation distance between the neighboring edges of the two resonator devices (the width of the ground conductor strip) can be selected to control the coupling strength between the resonator devices. In an example simulation, two coupled resonators were separated by a ground strip that was swept from 50 μm to 300 μm in width. The inter-resonator coupling strength between the resonator devices varied by about seven times over the swept range of the separation distance, while the Q factor remained relatively stable (+/−1.7% of 90) for distances greater than 150 μm. In particular, the frequency spacing between the resonators at 50 μm separation was 170 MHz while the frequency spacing between the resonators at 300 μm was 24 MHz. The resonator devices may be coupled by other techniques, for example, through an iris in a top or bottom enclosure or with transmission line tunnels made by an enclosure.

In some implementations, to reduce field loss and thus increase the Q factor of the resonator device, the participation ratio in the substrate dielectric can be reduced. One example technique to reduce the participation ratio includes introducing etching channels to remove the dielectric in the highest electric field location in the gap between the outer boundary of the capacitor pad and the inner boundary of the ground conductor. Another example technique to reduce the participation ratio includes bringing a top metallic lid close to the gap to pull fields into vacuum and further reduce the fields in the substrate. These and other techniques can be used alone or in combination to reduce field loss.

Figure 2:
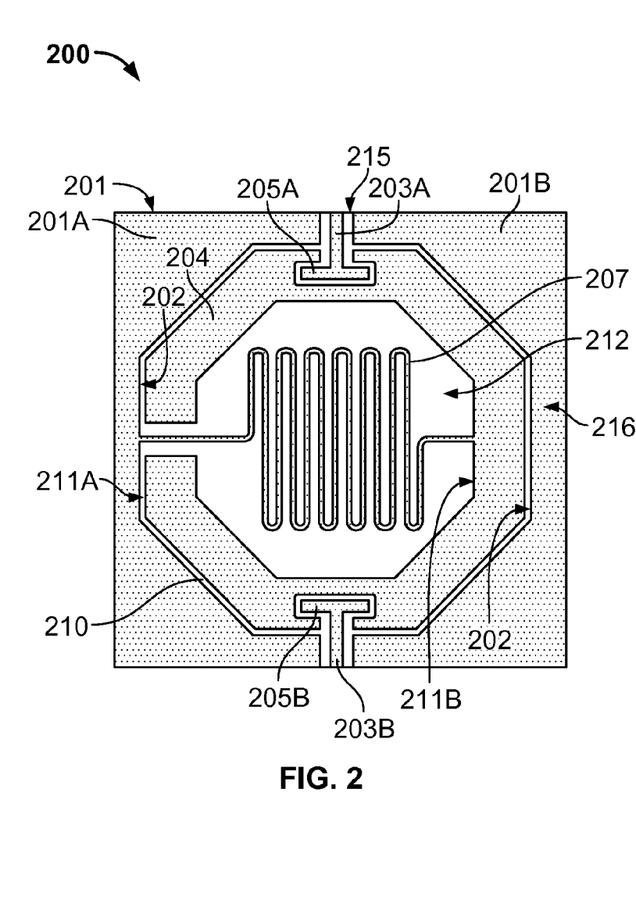
FIG. 2 is a diagram of a coplanar waveguide system that includes another example lumped-element device.

FIG. 2 is a diagram of a coplanar waveguide system 200 that includes another example lumped-element resonator device 216. The example coplanar waveguide system 200 may include additional or different features, and the components of a coplanar waveguide system can be arranged as shown in FIG. 2 or in another manner.

The example coplanar waveguide system 200 shown in FIG. 2 includes a single layer of conducting material on a dielectric substrate 215. In some cases, the coplanar waveguide system 200 includes multiple layers of conducting material. In the example shown in FIG. 2, the components of the resonator device 216 are planar structures made of the conducting material on the dielectric substrate 215. The example resonator device 216 is bordered by a planar ground conductor 201. The example ground conductor 201 shown in FIG. 2 includes a ground conductor portion 201A on the left side of the diagram and another ground conductor portion 201B on the right side of the diagram; the two ground conductor portions 201A, 201B are part of a common ground structure on the dielectric substrate 215.

The signal lines 203A, 203B can provide signaling and communication between the resonator device 216 and another device in the coplanar waveguide system 200 or another system. In the example shown in FIG. 2, the first signal line 203A extends between the ground conductor portions 201A, 201B and terminates at an end 205A that is capacitively coupled to one side of the capacitor pad 204; the second signal line 203B extends between the ground conductor portions 201A, 201B and terminates at an end 205B that is capacitively coupled to the opposite side of the capacitor pad 204.

The example resonator device 216 shown in FIG. 2 includes a capacitor pad 204 on the dielectric substrate 215 and a meander inductor 207 on the dielectric substrate 215. The example ground conductor 201 includes a cutout that is shaped to accommodate the resonator device 216, and the capacitor pad 204 is surrounded by the ground conductor 201. In the example shown in FIG. 2, the cutout in the ground conductor 201 and outer perimeter of the resonator device 216 are both octagonal, having eight sides of equal length.

The example resonator device 216 shown in FIG. 2 is similar to the example resonator device 116 shown in FIG. 1, and can be fabricated and used in a similar manner. The perimeter of the example resonator device 216 is octagonal and therefore has a different shape than the example resonator device 116 shown in FIG. 1. Accordingly, the cutout in the ground conductor 201 (defined by the inner boundary 202 of the ground conductor 201 shown in FIG. 2) is octagonal and therefore has a different shape than the square cutout in the example ground conductor 101 shown in FIG. 1.

In the example shown in FIG. 2, the ground conductor 201 serves as a second capacitor pad that forms a capacitance with the capacitor pad 204. The example capacitor pad 204 is capacitively coupled to the ground conductor 201 across a gap 210 between the outer boundary 211A of the capacitor pad 204 and inner boundary 202 of the ground conductor 201. The example capacitor pad 204 also has an inner boundary 211B that defines an interior clearance area 212 in the capacitor pad 204, and the meander inductor 207 resides in the interior clearance area 212 in the capacitor pad 204. The meander inductor is connected between the inner boundary 202 of the ground conductor 201 and the inner boundary 211B of the capacitor pad 204. The meander inductor 207 shown in FIG. 2 is an example of an inductive transmission line. In some cases, another type of inductive transmission line may be used in the example resonator device 216.

Figure 3A:
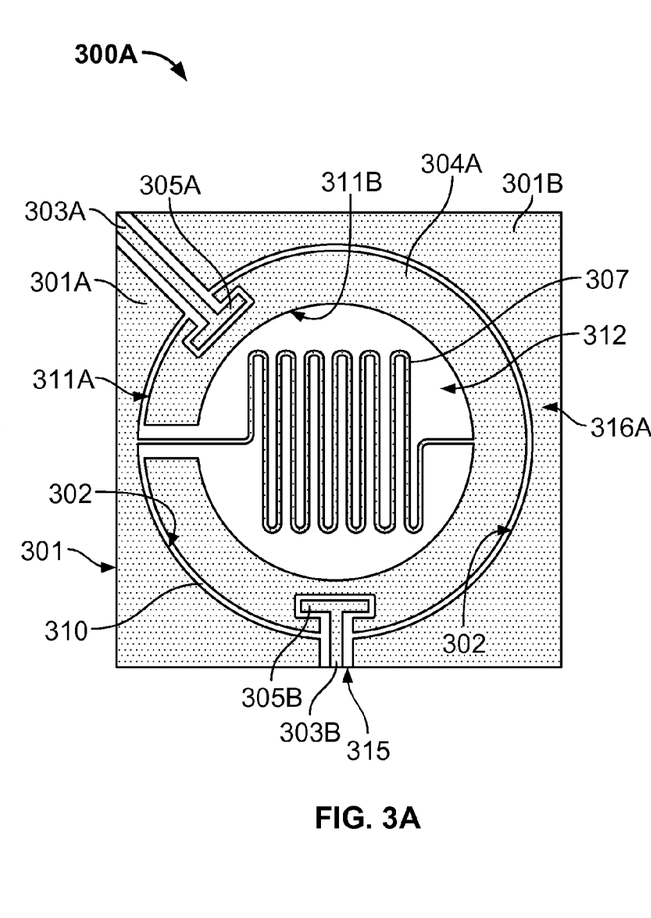
FIGS. 3A and 3B are diagrams of a coplanar waveguide systems that include further examples of lumped-element devices.

FIG. 3A is a diagram of a coplanar waveguide system 300A that includes another example lumped-element resonator device 316A. The example coplanar waveguide system 300A may include additional or different features, and the components of a coplanar waveguide system can be arranged as shown in FIG. 3A or in another manner.

The example coplanar waveguide system 300A shown in FIG. 3A includes a single layer of conducting material on a dielectric substrate 315. In some cases, the coplanar waveguide system 300A includes multiple layers of conducting material. In the example shown in FIG. 3A, the components of the resonator device 316A are planar structures made of conducting material on the dielectric substrate 315, and the example resonator device 316A is bordered by a planar ground conductor 301. The example shown in FIG. 3A includes two ground conductor portions 301A, 301B that are part of a common ground structure on the dielectric substrate 315.

The example resonator device 316A shown in FIG. 3A is similar to the example resonator device 116 shown in FIG. 1, and can be fabricated and used in a similar manner. The perimeter of the example resonator device 316A is circular and therefore has a different shape than the example resonator device 116 shown in FIG. 1. Accordingly, the cutout in the ground conductor 301 defined by the inner boundary 302 is also circular and therefore has a different shape than the square cutout in the example ground conductor 101 shown in FIG. 1.

The example resonator device 316A shown in FIG. 3A includes a capacitor pad 304A on the dielectric substrate 315 and a meander inductor 307 on the dielectric substrate 315. The example ground conductor 301 includes a cutout that is shaped to accommodate the resonator device 316A, and the capacitor pad 304A is surrounded by the ground conductor 301. In the example shown in FIG. 3A, the cutout in the ground conductor 301 and outer perimeter of the resonator device 316A are both circular.

The signal lines 303A, 303B can provide signaling and communication between the resonator device 316A and another device in the coplanar waveguide system 300A or another system. In the example shown in FIG. 3A, the first signal line 303A extends between the ground conductor portions 301A, 301B and terminates at an end 305A that is capacitively coupled to one side of the capacitor pad 304A; the second signal line 303B extends between the ground conductor portions 301A, 301B and terminates at an end 305B that is capacitively coupled to the opposite side of the capacitor pad 304A.

In the example shown in FIG. 3A, the ground conductor 301 serves as a second capacitor pad that forms a capacitance with the capacitor pad 304A. The example capacitor pad 304A is capacitively coupled to the ground conductor 301 across a gap 310 between the outer boundary 311A of the capacitor pad 304A and inner boundary 302 of the ground conductor 301. The example capacitor pad 304A has an inner boundary 311B that defines an interior clearance area 312 in the capacitor pad 304A. The meander inductor 307 resides in the interior clearance area 312 in the capacitor pad 304A. The meander inductor 307 is an example of an inductive transmission line. In some cases, another type of inductive transmission line may be used. The example capacitor pad 304A shown in FIG. 3A also includes two openings on its perimeter that allow the signal lines 303A, 303B to extend into voids where the ends 305A, 305B reside.

Figure 3B:
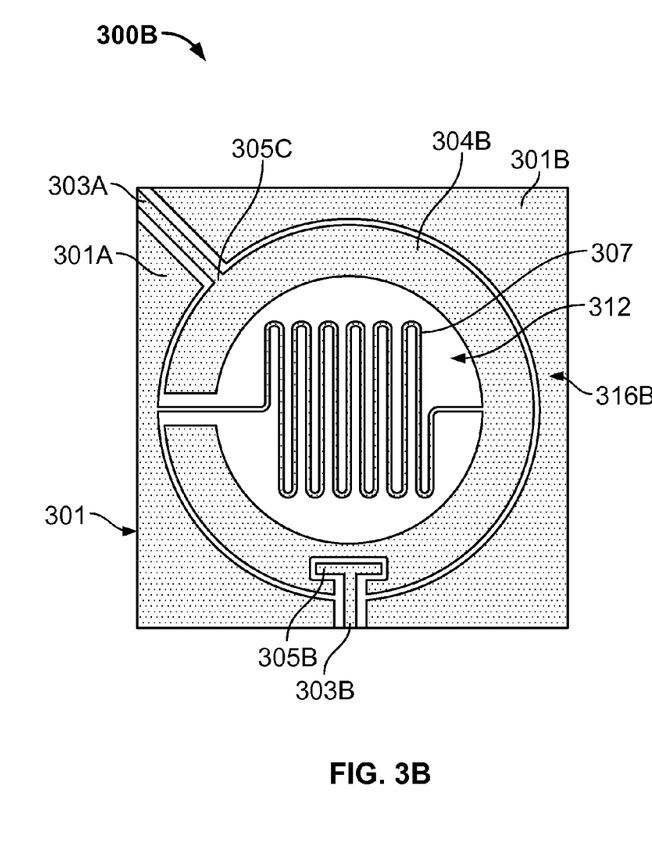

FIG. 3B is a diagram of a coplanar waveguide system 300B that includes another example lumped-element resonator device 316A. The example coplanar waveguide system 300B may include additional or different features, and the components of a coplanar waveguide system can be arranged as shown in FIG. 3B or in another manner.

The example coplanar waveguide system 300B is the same as the example coplanar waveguide system 300A shown in FIG. 3A, except that the first signal line 303A is conductively (rather than capacitively) coupled to the capacitor pad 304B. In particular, the signal line 303A shown in FIG. 3B extends between the ground conductor portions 301A, 301B to an end 305C that is conductively coupled to the capacitor pad 304B. Accordingly, the example capacitor pad 304B shown in FIG. 3B does not include the opening and void to accommodate capacitive coupling to the first signal line 303A.

Figure 4:
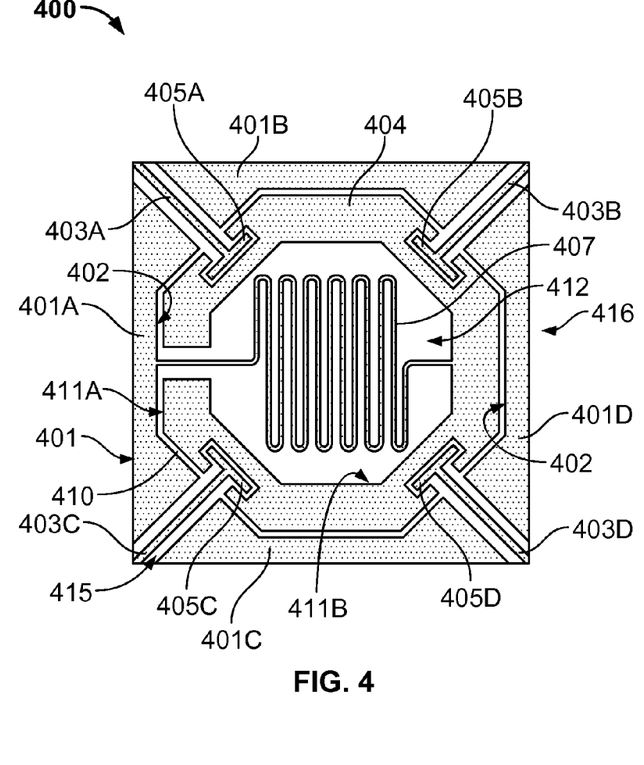
FIG. 4 is a diagram of a coplanar waveguide system that includes another example lumped-element device.

FIG. 4 is a diagram of a coplanar waveguide system 400 that includes another example lumped-element resonator device 416. The example coplanar waveguide system 400 may include additional or different features, and the components of a coplanar waveguide system can be arranged as shown in FIG. 4 or in another manner.

The example coplanar waveguide system 400 shown in FIG. 4 includes a single layer of conducting material on a dielectric substrate 415. In some cases, the coplanar waveguide system 400 includes multiple layers of conducting material. In the example shown in FIG. 4, the components of the resonator device 416 are planar structures made of conducting material on the dielectric substrate 415, and the example resonator device 416 is bordered by a planar ground conductor 401. The example shown in FIG. 4 includes four ground conductor portions 401A, 401B, 401C, 401D that are part of a common ground structure on the dielectric substrate 415.

The example resonator device 416 shown in FIG. 4 includes a capacitor pad 404 on the dielectric substrate 415 and a meander inductor 407 on the dielectric substrate 415. The example ground conductor 401 includes a cutout that is shaped to accommodate the resonator device 416, and the capacitor pad 404 is surrounded by the ground conductor 401. The example resonator device 416 shown in FIG. 4 is similar to the example resonator device 216 shown in FIG. 2, and can be fabricated and used in a similar manner. The example resonator device 416 is coupled to four signal lines 403A, 403B, 403C, 403D. Accordingly, the capacitor pad 404 includes additional openings on its perimeter to provide capacitive coupling with the signal lines 403A, 403B, 403C, 403D.

The signal lines 403A, 403B, 403C, 403D can provide signaling and communication between the resonator device 416 and another device in the coplanar waveguide system 400 or another system. In the example shown in FIG. 4, the first signal line 403A extends between the ground conductor portions 401A, 401B and terminates at an end 405A that is capacitively coupled to one side of the capacitor pad 404; the second signal line 403B extends between the ground conductor portions 401B, 401D and terminates at an end 405B that is capacitively coupled to another side of the capacitor pad 404; the third signal line 403C extends between the ground conductor portions 401A, 401C and terminates at an end 405C that is capacitively coupled to another side of the capacitor pad 404; the fourth signal line 403D extends between the ground conductor portions 401C, 401D and terminates at an end 405D that is capacitively coupled to another side of the capacitor pad 404.

In the example shown in FIG. 4, the ground conductor 401 serves as a second capacitor pad that forms a capacitance with the capacitor pad 404. The example capacitor pad 404 is capacitively coupled to the ground conductor 401 across a gap 410 between the outer boundary 411A of the capacitor pad 404 and inner boundary 402 of the ground conductor 401. The example capacitor pad 404 has an inner boundary 411B that defines an interior clearance area 412 in the capacitor pad 404. The meander inductor 407 resides in the interior clearance area 412 in the capacitor pad 404. The meander inductor 407 shown in FIG. 4 is an example of an inductive transmission line. In some cases, another type of inductive transmission line may be used in the example resonator device 416. The example capacitor pad 404 shown in FIG. 4 also includes four openings on its perimeter that allow the signal lines 403A, 403B, 403C, 403D to extend into voids where the ends 405A, 405B, 405C, 405D reside.

Figure 5:
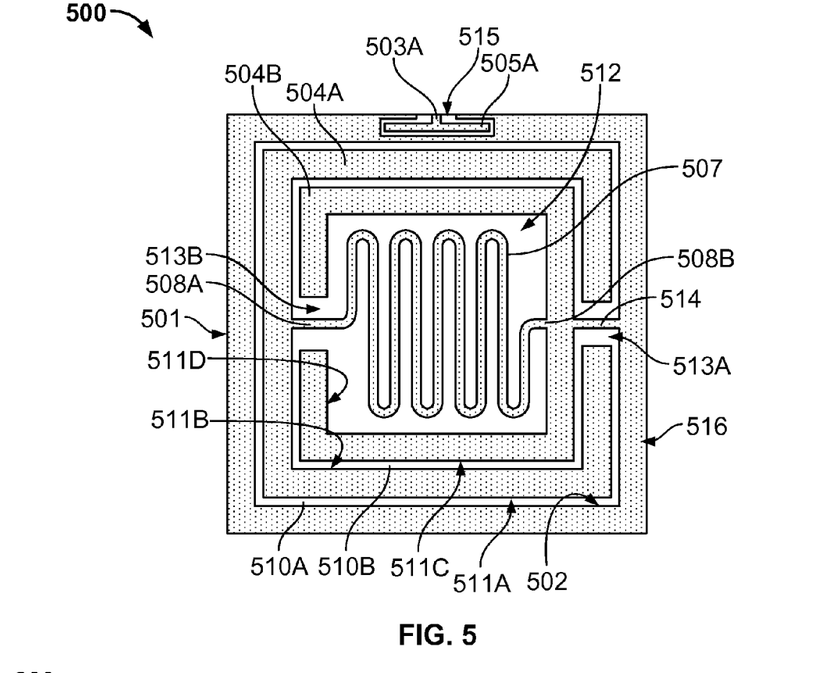
FIG. 5 is a diagram of a coplanar waveguide system that includes another example lumped-element device.

FIG. 5 is a diagram of a coplanar waveguide system 500 that includes another example lumped-element resonator device 516. The example coplanar waveguide system 500 may include additional or different features, and the components of a coplanar waveguide system can be arranged as shown in FIG. 5 or in another manner.

The example coplanar waveguide system 500 shown in FIG. 5 includes a single layer of conducting material on a dielectric substrate 515. In some cases, the coplanar waveguide system 500 includes multiple layers of conducting material. In the example shown in FIG. 5, the components of the resonator device 516 are planar structures made of the conducting material on the dielectric substrate 515. The example resonator device 516 is bordered by a planar ground conductor 501.

The example resonator device 516 shown in FIG. 5 includes an outer capacitor pad 504A on the dielectric substrate 515, an inner capacitor pad 504B on the dielectric substrate 515 and a meander inductor 507 on the dielectric substrate 515. The example ground conductor 501 includes a cutout that is shaped to accommodate the resonator device 516, and the capacitor pads 504A, 504B are surrounded by the ground conductor 501. In the example shown in FIG. 5, the cutout in the ground conductor 501 and outer perimeter of the resonator device 516 are both square.

The signal line 503A can provide signaling and communication between the resonator device 516 and another device in the coplanar waveguide system 500 or another system. In the example shown in FIG. 5, the signal line 503A extends between the ground conductor portions and terminates at an end 505A that is capacitively coupled to one side of the outer capacitor pad 504A.

The example resonator device 516 shown in FIG. 5 is similar to the example resonator device 116 shown in FIG. 1, and can be fabricated and used in a similar manner. The example resonator device 516 includes two capacitor pads, with the inner capacitor pad 504B nested inside the outer capacitor pad 504A. In the example shown in FIG. 5, the ground conductor 501 serves as a third capacitor pad that forms a capacitance with the outer capacitor pad 504A. The example outer capacitor pad 504A is capacitively coupled to the ground conductor 501 across a gap 510A between the outer boundary 511A of the outer capacitor pad 504A and inner boundary 502 of the ground conductor 501. The example outer capacitor pad 504A also has an inner boundary 511B that is separated from an outer boundary 511C of the inner capacitor pad 504B by a gap 510A. The meander inductor 507 is connected between the inner boundary 511B of the outer capacitor pad 504A and the inner boundary 511D of the inner capacitor pad 504B. The two capacitor pads in the example resonator device 516 shown in FIG. 5 create two series capacitances to ground, which decreases the effective capacitance (whereas parallel capacitors would increase effective capacitance).

In the example shown in FIG. 5, the outer capacitor pad 504A serves as a second capacitor pad that forms a capacitance with the inner capacitor pad 504B. The example inner capacitor pad 504B is capacitively coupled to the outer capacitor pad across a gap 510B between the outer boundary 511C of the inner capacitor pad 504B and inner boundary 511B of the outer capacitor pad 504A. The example inner capacitor pad 504B also has an inner boundary 511D that defines an interior clearance area 512 in the inner capacitor pad 504B, and the meander inductor 507 resides in the interior clearance area 512 in the inner capacitor pad 504B. A first end 508A of the meander inductor 507 extends from the inner boundary 511B through an opening 513B in the inner capacitor pad 504B into the interior clearance area 512 in the inner capacitor pad 504B. A second end 508B of the meander inductor 507 extends from the inner boundary 511D of the capacitor pad 504B. The meander inductor 507 shown in FIG. 5 is an example of an inductive transmission line. In some cases, another type of inductive transmission line may be used in the example resonator device 516. A conductive strip 514 connects the inner capacitor pad 504B to the ground conductor 501. As shown in FIG. 5, the conductive strip 514 extends from the outer boundary 511C of the inner capacitor pad 504B, through an opening 513A in the side of the outer capacitor pad 504A, to the inner boundary 502 of the ground conductor 501, conductively connected at both ends.

Figure 6A:
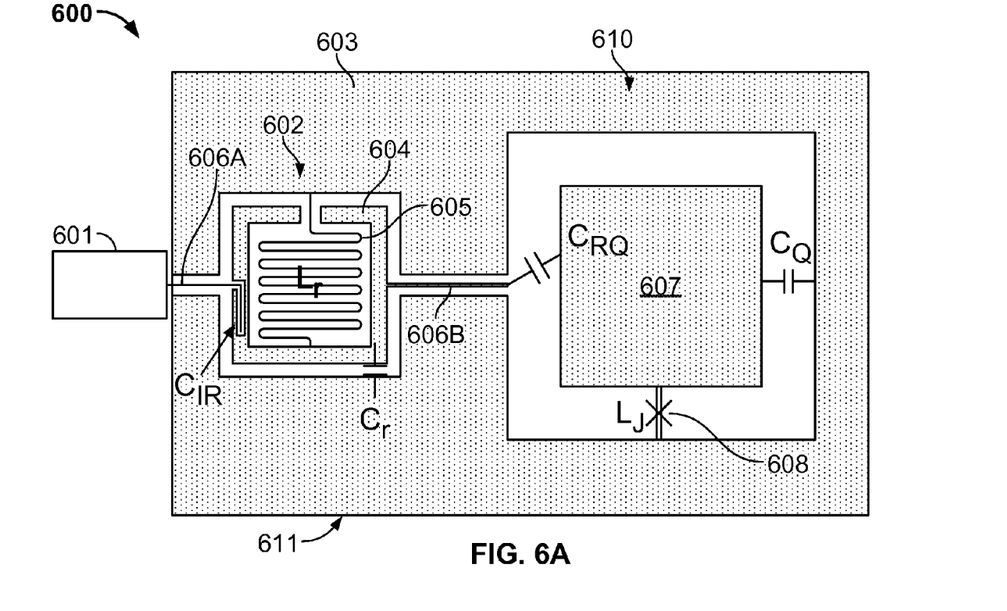
FIG. 6A is a diagram of a quantum information control circuit that includes an example lumped-element resonator device.
Figure 6B:
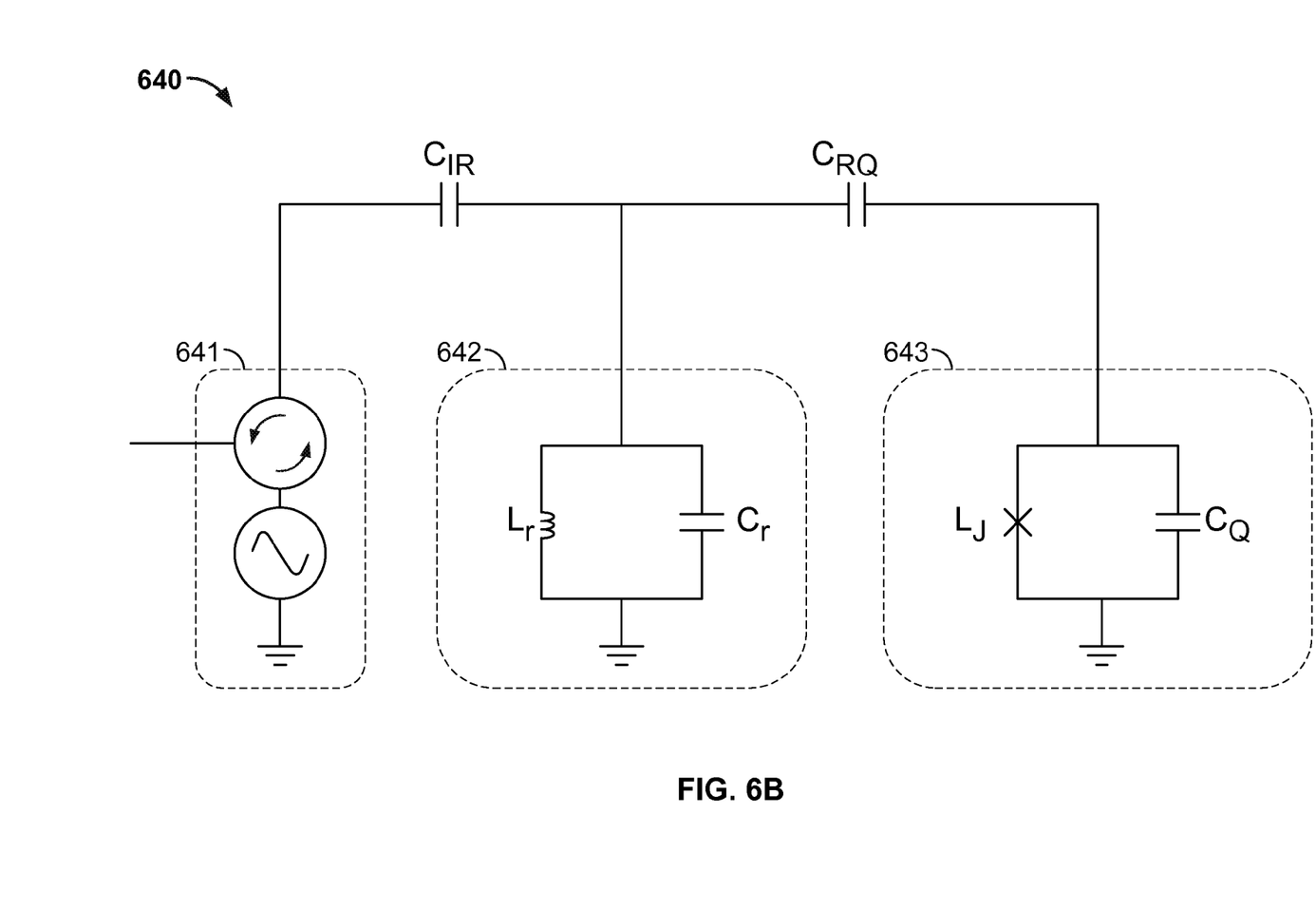
FIG. 6B is a circuit diagram showing an equivalent circuit model of the quantum information control circuit 600 shown in FIG. 6A.

FIG. 6A is a diagram of a quantum information control circuit 600 that includes an example lumped-element resonator device 602 coupled between an example control system 601 and an example qubit device 610; FIG. 6B is a circuit diagram showing an equivalent circuit model 640 of the quantum information control circuit 600 shown in FIG. 6A.

In the example shown in FIG. 6A, the resonator device 602 and qubit device 610 each include planar metal structures on the surface of a dielectric substrate 611. A ground conductor 603 on the surface of the dielectric substrate 611 includes cutouts that accommodate the resonator device 602 and the qubit device 610. Signal lines 606A, 606B (residing in respective channels defined in the ground conductor 603) provide signaling and communication between the functional components of the quantum information control circuit 600.

As shown in FIG. 6A, the example resonator device 602 includes a capacitor pad 604 and a meander inductor 605, where the meander inductor 605 is nested in an interior clearance area in the capacitor pad 604. The resonator device 602 can be implemented according to any of the example resonator devices shown in FIGS. 1A, 2, 3A, 3B, 4 and 5 or in another manner. Also shown in FIG. 6A, the qubit device 610 includes a pad 607 coupled to a Josephson junction 608. The resonator device 602 is connected in series between the control system 601 and the qubit device 610. A quantum information control circuit 600 may include additional or different features, and the components of a quantum information control circuit can be arranged as shown or in another manner.

In the circuit model 640, the example resonator device 602 is represented by a resonant circuit 642 that includes an effective inductance ($L_r$) and effective capacitance ($C_r$) in parallel. Sources of the effective inductance ($L_r$) and effective capacitance ($C_r$) in the quantum information control circuit 600 are labeled in FIG. 6A. As shown in FIG. 6A, the effective inductance ($L_r$) of the resonator device 602 is provided by the meander inductor 605, and the effective capacitance ($C_r$) of the resonator device 602 is provided by the gap between the capacitor pad and the ground conductor 603

In the circuit model 640, the example qubit device 610 is represented by a resonant circuit 643 that includes an effective inductance ($L_J$) and effective capacitance ($C_Q$) in parallel. Sources of the effective inductance ($L_J$) and effective capacitance ($C_Q$) in the quantum information control circuit 600 are labeled in FIG. 6A. As shown in FIG. 6A, the effective inductance ($L_J$) of the qubit device 610 is provided by the Josephson junction 608, and the effective capacitance ($C_Q$) of the qubit device 610 is provided by a gap between the pad 607 and the ground conductor 603.

As shown in FIG. 6A, the control system 601 is connected to a signal line 606A that is capacitively coupled to the capacitor pad 604 of the resonator device 602. The capacitive coupling between the signal line 606A and the resonator device 602 is represented by the capacitance $C_{IR}$ between the control circuit 641 and the resonant circuit 642 in the circuit model 640 shown in FIG. 6B. As shown in FIG. 6A, the qubit device 610 is capacitively coupled to the signal line 606B, which is conductively coupled to the capacitor pad 604 of the resonator device 602. The capacitive coupling between the signal line 606B and the qubit device 610 is represented by the capacitance $C_{RQ}$ between the two resonant circuits 642, 643 in the circuit model 640 shown in FIG. 6B.

In the circuit model 640 shown in FIG. 6B, the control system 601 is represented by a control circuit 641 that includes a signal source in an output signal processing system. The signal source can include, for example, an arbitrary waveform generator and associated hardware (e.g., filters, multiplexers, etc.) configured to generate a microwave signal and deliver the microwave signal to the quantum information control circuit 600. For instance, the microwave signal can be configured (e.g., by software running on a classical computer) to perform a logical control operation on the qubit device. The output signal processing system can include, for example, a digitizer and associated hardware (e.g., amplifiers, filters, multiplexers, etc.) configured to obtain output signals from the quantum information control circuit 600. For instance, the output signal processing system can provide the output signals to a microprocessor or another type of classical computing system for analysis.

The example quantum information control circuit 600 in FIG. 6A shows an example system where a resonator device is used in connection with other circuit elements for storing and processing quantum information. In some implementations, multiple resonator devices and other circuit elements can be used as building blocks in quantum information processing circuits and other types of quantum microwave integrated circuits. For instance, such resonator devices can be implemented in a manner that is compatible with standard wafer-scale processing, qubit microfabrication, and other system-level manufacturing processes.

In some implementations, the example quantum information control circuit 600 or its components can be used in a quantum computing system of the type described in PCT App. No. PCT/US2015/018126, filed Feb. 27, 2015, entitled "Housing Qubit Devices in an Electromagnetic Waveguide System," which is hereby incorporated by reference for all purposes. For instance, the resonator device 602 or any of the resonator devices shown and described in the present application can be used as readout resonators or in other devices in a quantum computing system of the type described in the PCT application (App. No. PCT/US2015/018126, filed Feb. 27, 2015, entitled "Housing Qubit Devices in an Electromagnetic Waveguide System").

In the example shown in FIG. 6A, the resonator device 602 can be a microwave frequency superconducting resonator that operates in an environment (e.g., at temperatures less than 10 mK) where macroscopic devices operate quantum-mechanically (e.g., as an artificial atom with discrete energy states, as a quantum bit, etc.). In some systems, information can be stored in one or more quantum bits, and the information storage capacity of the system can scale exponentially with the number of coupled quantum bits in the system. In some systems, large arrays of microwave frequency resonators operating as quantum bits can be constructed and can meet certain system criteria. For example, the system may, in some cases, require that all quantum bits are independently addressable with external control signals, that all quantum bits be close enough together that they can be coupled on demand, that all quantum bits be measurable weakly to preserve the state of information, or a combination of these and other requirements. In some quantum computing systems, the pitch between qubits is finite and non-arbitrary, and miniaturizing auxiliary microwave resonators provides advantages. In some quantum computing systems, the weak measurement can be provided by an auxiliary microwave resonator (e.g., a readout resonator) that is weakly coupled to a qubit by an engineered coupling factor. In some quantum computing systems, filters that include electromagnetic resonators are used to provide isolation of the qubit frequency from interfacing with an external environment. In some implementations, the example resonator devices can accomplish one or more of these objectives, for example, allowing qubits to be connected to nearly lossless superconducting readout resonators that fit with a qubit lattice. Size reduction, spurious mode isolation, simplicity fabrication and scalability of components may also provide advantages in quantum computing systems.

FIG. 7 is a diagram of a microstrip system 700 that includes another example lumped-element resonator device 716. The example microstrip system 700 may include additional or different features, and the components of a microstrip system can be arranged as shown in FIG. 7 or in another manner.

The example microstrip system 700 shown in FIG. 7 includes a single layer of conducting material on a first side 751 of a dielectric substrate 715 and single layer of conducting material on a second, opposite side 752 of the dielectric substrate 715. In some cases, the microstrip system 700 includes multiple layers of conducting material. In the example shown in FIG. 7, the components of the resonator device 716 are planar structures made of the conducting material covering a portion of the first side 751 of the dielectric substrate 715, and the planar ground conductor 701 is made of the conducting material covering the full area of the second side 752 of the dielectric substrate 715. The example resonator device 716 is separated from the ground conductor 701 by the vertical thickness of the dielectric substrate 715.

The example resonator device 716 shown in FIG. 7 includes a capacitor pad 704 on the dielectric substrate 715 and a meander inductor 707 on the dielectric substrate 715. A signal line 703 can provide signaling and communication between the resonator device 716 and another device in the microstrip system 700 or another system.

In the example shown in FIG. 7, the ground conductor 701 serves as a second capacitor pad that forms a capacitance 730 with the capacitor pad 704. The example capacitor pad 704 is capacitively coupled to the ground conductor 701 across the thickness of the dielectric substrate 715. The example capacitor pad 704 has an outer boundary 711A and an inner boundary 711B. The inner boundary 711B defines an interior clearance area 712 in the capacitor pad 704, and the meander inductor 707 resides in the interior clearance area 712 in the capacitor pad 704. The meander inductor 707 shown in FIG. 7 is an example of an inductive transmission line. In some cases, another type of inductive transmission line may be used in the example resonator device 716. The meander inductor 707 is connected between the inner boundary 711B and a via 740. In the example shown, the via 740 extends through the thickness of the dielectric substrate 715 between the ground conductor 701 and a first end 708A of the meander inductor 707; the meander inductor 707 extends from the first end 708A to a second end 708B that is conductively connected to the inner boundary 711B of the capacitor pad 704. The example meander inductor 707 includes ten full turns between the first end 708A and the second end 708B.

In some implementations, the systems described here, including the resonator devices, coplanar waveguide systems, control circuits and other components, can be manufactured by adapting tools and methodologies that are commonly used for micro- and nano-fabrication. As an example, the resonator devices may be formed by a fabrication process that includes spinning a photoresist material onto a wafer and then baking the wafer; projecting a mask pattern onto the photoresist using a photolithography system; developing, cleaning and baking the exposed wafer; depositing the conductor material on the wafer to form metallized areas on the surface; stripping the remaining photoresist and cleaning the wafer. The patterned wafer can then be further processed for use or incorporated into another system for use. The following recipe is an example that may be used to fabricate one or more of the resonator devices described here: (1) spin S1813 photoresist onto a clean (e.g., >=10 kOhm·cm) silicon wafer at 500 rpm for 5 seconds, then 4000 rpm for 5 seconds (~1.3 um thickness); (2) softbake at 115° C. for 60 seconds; (3) align mask with geometry pattern, present to sample and expose to UV (e.g., GCA 8500 G-Line (0.35 NA)); (4) develop photoresist with MIF-319 developer for 60 seconds to remove photoresist in areas that are to be metallized (photoresist will remain in gaps); (5) clean, rinse, dry sample; (6) softbake at 115° C. for 60 seconds; (7) under vacuum, evaporate 0.5 μm to 1 μm aluminum with e-beam evaporator onto sample; (8) strip remaining photoresist with DMSO, to lift off metal in gap locations; (9) clean, rinse, dry sample. In some cases, the patterned wafer can then be assembled within a connectorized enclosure or deployed for use in another environment. Other manufacturing processes, including different recipes and different fabrication tools and methodologies, may be used to form the systems described here in some instances.

In some implementations, the systems described here, including the resonator devices, coplanar waveguide systems, control circuits and other components, can be used in a number of contexts or applications, and may provide technical advantages in some instances. As an example, systems described here may be used as basic building blocks for quantum microwave components (superconducting or non-superconducting), such as, for example, quantum limited parametric amplifiers, Josephson parametric amplifiers, Purcell filters or others. As another example, some of the systems described here include miniaturized analog RF filters, multiplexers or demultiplexers for size and weight reduction of RF components used in satellites, aircraft, portable electronics, superconducting electronic score, quantum information processing components (e.g., in a dilution fridge) and others. As another example, systems described here may provide ease of tuning inductance (L), capacitance (C), input coupling and other parameters within a prescribed footprint. In some cases, the tuning can be provided by adjusting a single physical parameter or multiple physical parameters of the system (e.g., gap width, trace length, etc.). As another example, systems described here may provide miniature microwave integrated circuit resonators for use in a quantum processor, which may include, for example, on-chip superconducting (or non-superconducting) multiplexers or demultiplexers for reducing the number of signal lines and thereby reducing the heat load within a "cold" measurement setup, on-chip superconducting (or non-superconducting) multiplexers or demultiplexers for reducing the number of electronics channels for quantum competition control signals, on-chip integration of superconducting (or non-superconducting) readout resonators with Josephson junctions. As another example, systems described here may provide monolithic microwave integrated filter circuits.

While this specification contains many details, these should not be construed as limitations on the scope of what may be claimed, but rather as descriptions of features specific to particular examples. Certain features that are described in this specification in the context of separate implementations can also be combined. Conversely, various features that are described in the context of a single implementation can also be implemented in multiple embodiments separately or in any suitable subcombination.

A number of embodiments have been described. Nevertheless, it will be understood that various modifications can be made. Accordingly, other embodiments are within the scope of the following claims.

What is claimed is:

1. A quantum information processing circuit comprising: a dielectric substrate; and
a lumped-element device on the dielectric substrate, the lumped-element device comprising:
  a first capacitor pad on the dielectric substrate, the first capacitor pad being capacitively coupled to a second capacitor pad, the first capacitor pad having an outer boundary and an inner boundary, the inner boundary defining an interior clearance area in the first capacitor pad; and
  an inductive transmission line on the dielectric substrate in the interior clearance area in the first capacitor pad;
wherein the lumped-element device comprises a microwave resonator device having a resonance frequency in the range of two hundred (200) MHz to twenty (20) GHz, and the largest spatial dimension of the lumped-element device is less than one-tenth of a guided wavelength at the lowest-mode resonance frequency of the lumped-element device.

2. The quantum information processing circuit of claim 1, comprising a coplanar waveguide topology, wherein the lumped-element device resides on a first side of the dielectric substrate, and the quantum information processing circuit comprises a ground conductor on the first side of the dielectric substrate.

3. The quantum information processing circuit of claim 1, comprising a microstrip topology, wherein the lumped-element device resides on a first side of the dielectric substrate, and the quantum information processing circuit comprises a ground conductor on a second, opposite side of the dielectric substrate.

4. The quantum information processing circuit of claim 1, wherein the second capacitor pad comprises a ground conductor.

5. The quantum information processing circuit of claim 1, wherein the inductive transmission line comprises a meander inductor in the interior clearance area in the first capacitor pad.

6. The quantum information processing circuit of claim 1, wherein the lumped-element device comprises a filter device.

7. The quantum information processing circuit of claim 1, comprising a ground conductor, wherein the inductive transmission line comprises an end conductively coupled to the ground conductor.

8. The quantum information processing circuit of claim 1, comprising a ground conductor, wherein the inductive transmission line comprises:
a first end coupled to the inner boundary of the first capacitor pad; and
a second end coupled to the ground conductor.

9. The quantum information processing circuit of claim 1, further comprising a qubit device coupled to the lumped-element device.

10. The quantum information processing circuit of claim 1, wherein the first capacitor pad and the inductive transmission line comprise superconducting material.

11. The quantum information processing circuit of claim 1, wherein the dielectric substrate comprises at least one of silicon, sapphire or diamond.

12. The quantum information processing circuit of claim 1, wherein the lumped-element device comprises a microwave resonator device having a resonance frequency that is defined at least in part by:
a capacitance between the first and second capacitor pads; and
an inductance of the inductive transmission line.

13. The quantum information processing circuit of claim 1, wherein the inductive transmission line resides in the interior clearance area in the first capacitor pad, and is surrounded by the first capacitor pad.

14. The quantum information processing circuit of claim 1, wherein the largest spatial dimension of the lumped-element device is less than one-twentieth of a guided wavelength at the lowest-mode resonance frequency of the lumped-element device.

15. A method of forming a lumped-element device in a quantum information processing circuit, the method comprising:
receiving a dielectric substrate;
forming a first capacitor pad on a surface of the dielectric substrate, the first capacitor pad being capacitively coupled to a second capacitor pad, the first capacitor pad having an outer boundary and an inner boundary, the inner boundary defining an interior clearance area in the first capacitor pad;
forming an inductive transmission line on the dielectric substrate in the interior clearance area in the first capacitor pad;
wherein forming the lumped-element device comprises forming a microwave resonator device having a resonance frequency in the range of two hundred (200) MHz to twenty (20) GHz, and the largest spatial dimension of the lumped-element device is less than one-tenth of a guided wavelength at the lowest-mode resonance frequency of the lumped-element device.

16. The method of claim 15, wherein at least a portion of the first capacitor pad and the inductive transmission line are formed by depositing a single layer of conductor material on the dielectric substrate.

17. The method of claim 15, comprising defining a size parameter of the inductive transmission line to control a resonance frequency of the microwave resonator device.

18. The method of claim 15, wherein the first capacitor pad and the inductive transmission line comprise superconducting material.

19. The method of claim 15, wherein the dielectric substrate comprises at least one of silicon, sapphire or diamond.

20. The method of claim 15, wherein the lumped-element device comprises a microwave resonator device having a resonance frequency that is defined at least in part by:
a capacitance between the first and second capacitor pads; and
an inductance of the inductive transmission line.

21. The method of claim 15, comprising defining a size parameter of the first and second capacitor pads to control a resonance frequency of the microwave resonator device.

22. The method of claim 15, wherein the inductive transmission line is formed such that the inductive transmission line resides in the interior clearance area in the first capacitor pad, and is surrounded by the first capacitor pad.

23. The method of claim 15, wherein the largest spatial dimension of the lumped-element device is less than one-twentieth of a guided wavelength at the lowest-mode resonance frequency of the lumped-element device.

24. A quantum information processing circuit comprising:
a qubit device; and
a resonator device coupled to the qubit device, the resonator device comprising:
a first capacitor pad on a dielectric substrate, the first capacitor pad being capacitively coupled to a second capacitor pad, the first capacitor pad having an outer boundary and an inner boundary, the inner boundary defining an interior clearance area in the first capacitor pad; and
an inductive transmission line on the dielectric substrate in the interior clearance area in the first capacitor pad;
wherein the resonator device comprises a microwave resonator device having a resonance frequency in the range of two hundred (200) MHz to twenty (20) GHz, and the largest spatial dimension of the resonator device is less than one-tenth of a guided wavelength at the lowest-mode resonance frequency of the resonator device.

25. The quantum information processing circuit of claim 24, comprising a signal line on the dielectric substrate, the signal line providing communication between the resonator device and the qubit device.

26. The quantum information processing circuit of claim 24, wherein the inductive transmission line comprises a meander inductor in the interior clearance area in the first capacitor pad.

27. The quantum information processing circuit of claim 24, wherein the inductive transmission line resides in the interior clearance area in the first capacitor pad, and is surrounded by the first capacitor pad.

28. The quantum information processing circuit of claim 24, wherein the largest spatial dimension of the lumped-element device is less than one-twentieth of a guided wavelength at the lowest-mode resonance frequency of the lumped-element device.

29. A quantum information processing circuit comprising:
a dielectric substrate;
a lumped-element device on the dielectric substrate, the lumped-element device comprising:

a first capacitor pad on the dielectric substrate, the first capacitor pad being capacitively coupled to a second capacitor pad, the first capacitor pad having an outer boundary and an inner boundary, the inner boundary defining an interior clearance area in the first capacitor pad; and an inductive transmission line on the dielectric substrate in the interior clearance area in the first capacitor pad; and a ground conductor, wherein the second capacitor pad resides in an interior clearance area of the ground conductor, and the first capacitor pad resides in an interior clearance area of the second capacitor pad.

30. A quantum information processing circuit comprising:

a dielectric substrate;

a lumped-element device on the dielectric substrate, the lumped-element device comprising:

a first capacitor pad on the dielectric substrate, the first capacitor pad being capacitively coupled to a second capacitor pad, the first capacitor pad having an outer boundary and an inner boundary, the inner boundary defining an interior clearance area in the first capacitor pad; and an inductive transmission line on the dielectric substrate in the interior clearance area in the first capacitor pad;

wherein the second capacitor pad has an outer boundary and an inner boundary, the inner boundary of the second capacitor pad defines an interior clearance area in the second capacitor pad, and the first capacitor pad resides in the interior clearance area in the second capacitor pad.

* * * * *

Disclaimer

9,893,262 B2 - Dane Christoffer Thompson, Granite Bay, CA (US); Chad Tyler Rigetti, Emeryville, CA (US). LUMPED-ELEMENT DEVICE FOR QUANTUM INFORMATION PROCESSING SYSTEMS. Patent dated February 13, 2018. Disclaimer filed May 13, 2020, by the assignee, Rigetti & Co., Inc I hereby disclaim the following complete claims 1-12, 14-21, 23-26, 28 of said patent.

*(Official Gazette, September 27, 2022)*